United States Patent
Krishnan et al.

(10) Patent No.: US 7,402,895 B2
(45) Date of Patent: Jul. 22, 2008

(54) SEMICONDUCTOR PACKAGE STRUCTURE AND METHOD OF MANUFACTURE

(75) Inventors: Shutesh Krishnan, Johor (MY); Jatinder Kumar, Jalandhar (IN)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 102 days.

(21) Appl. No.: 11/403,978

(22) Filed: Apr. 14, 2006

(65) Prior Publication Data
US 2007/0138610 A1    Jun. 21, 2007

(30) Foreign Application Priority Data
Dec. 20, 2005    (MY) ............................... PI 2005 6037

(51) Int. Cl.
*H01L 23/495*    (2006.01)

(52) U.S. Cl. ...................................... 257/676; 257/678
(58) Field of Classification Search .......... 257/E29.061, 257/684, 676, 678
See application file for complete search history.

(56) References Cited

U.S. PATENT DOCUMENTS

| | | | | |
|---|---|---|---|---|
| 6,605,866 | B1 * | 8/2003 | Crowley et al. | 438/123 |
| 2004/0000702 | A1 * | 1/2004 | Knapp et al. | 257/666 |

* cited by examiner

*Primary Examiner*—Douglas M Menz
(74) *Attorney, Agent, or Firm*—Kevin B. Jackson

(57) ABSTRACT

In one embodiment, a semiconductor package includes a conductive slug and columnar leads in spaced relationship thereto. The columnar leads are coupled to an electronic device attached to the slug, and are exposed at least on one side of the package opposite the die attach slug. The die attach slug is further exposed to provide a package configured in a slug up orientation.

20 Claims, 4 Drawing Sheets

400

401

401

SEMICONDUCTOR PACKAGE STRUCTURE AND METHOD OF MANUFACTURE

FIELD OF THE INVENTION

This invention relates generally to electronic devices, and more specifically to semiconductor packages and methods of assembly.

BACKGROUND OF THE INVENTION

The handheld consumer products market is aggressive in the miniaturization of portable electronics. Driven primarily by the cellular phone and digital assistant markets, manufacturers of these devices are challenged by ever shrinking formats and the demand for more PC-like functionality. This challenge asserts pressure on surface mount component manufacturers to design their products to command the smallest area possible. By doing so, this allows portable electronics designers to incorporate additional functions within a device without increasing the overall product size.

In Chip Scale Packaging (CSP) technologies, manufacturers strive to bring the package size as close as possible to the size of the semiconductor chip. The electronics industry has accepted the Joint Electronic Device Engineering Council (JEDEC) defined Quad Flat Pack No Lead (QFN) outlines as good alternatives for low cost chip scale packages. In typical QFN packages, the lower side of a semiconductor chip is attached to a metal lead die attach paddle. Wire bonds are then used to connect circuitry located on the front side of the chip to leads. The chip and lead frame are covered by an epoxy resin to form an assembled component. The die attach paddle and the leads are then attached to a next level of assembly such as printed circuit board.

FIG. 1 shows a cross-sectional view of a conventional QFN package 10 including lead frame 11. Lead frame 11 comprises a slug, flag or die attach portion 13 for supporting semiconductor chip 14, and leads 16. Wire bonds 17 connect semiconductor chip 14 to leads 16. Epoxy layer 19 covers semiconductor chip 14 and portions of lead frame 11, while leaving lower portions of flag 13 and leads 16 exposed. In the QFN package, leads 16 terminate at the edge of the package to provide a smaller package footprint. QFN packages typically are square with leads 16 present on all four sides of the lower surface of the package. FIG. 1 shows package 10 attached to a printed circuit board 21, which includes attach or bond pads 22. FIGS. 2 and 3 are isometric top and bottom views respectively of package 10. As shown in FIG. 3, slug 13 and leads 16 are both exposed on the bottom or lower surface of package 10 for attaching to printed circuit board 21.

There are several advantages to QFN packages including small package footprints, matrix lead frame arrays that allow for easier assembly, and established automated assembly tools. However, there are several problems associated with these packages including poor heat transfer capability for high power device applications. Specifically, in device 10 slug 13 is placed next to or adjacent printed circuit board 21, which must accommodate for heat dissipation. This results in inefficient heat dissipation and heat transfer problems, which impact device performance, reliability, and product life span.

Accordingly, a need exists for a package structure and method of assembly that provide enhanced heat dissipation capability. It is desirable for such a structure and method of assembly to be cost effective by using, for example, existing assembly process techniques.

DETAILED DESCRIPTION OF THE DRAWINGS

Figure 1:
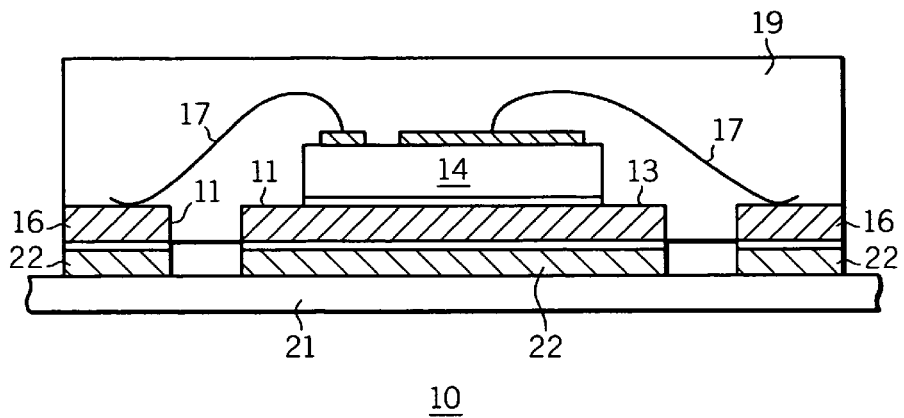
FIG. 1 illustrates a cross-sectional view of a prior art Quad Flat Pack No Lead (QFN) package.
Figure 2:
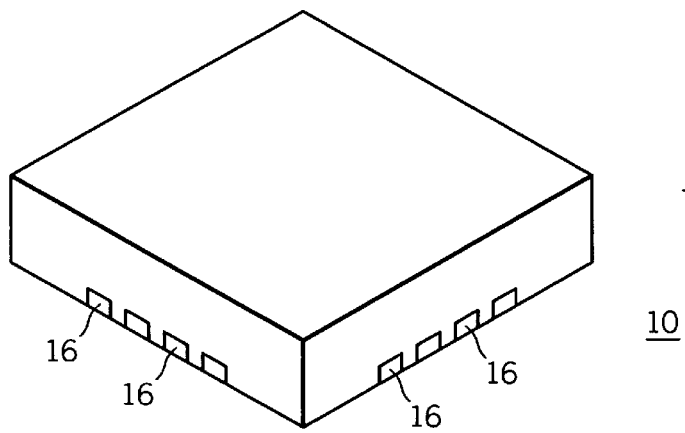
FIG. 2 illustrates an isometric top view of the prior art QFN package of FIG. 1.
Figure 3:
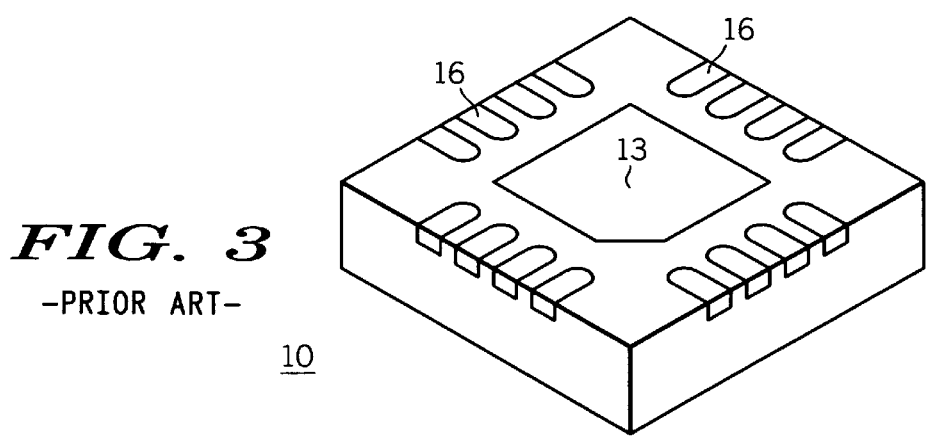
FIG. 3 illustrates an isometric bottom view of the prior art QFN package of FIG. 1.

For ease of understanding, elements in the drawing figures are not necessarily drawn to scale, and like element numbers are used where appropriate throughout the various figures to denote the same or similar elements.

Figure 4:
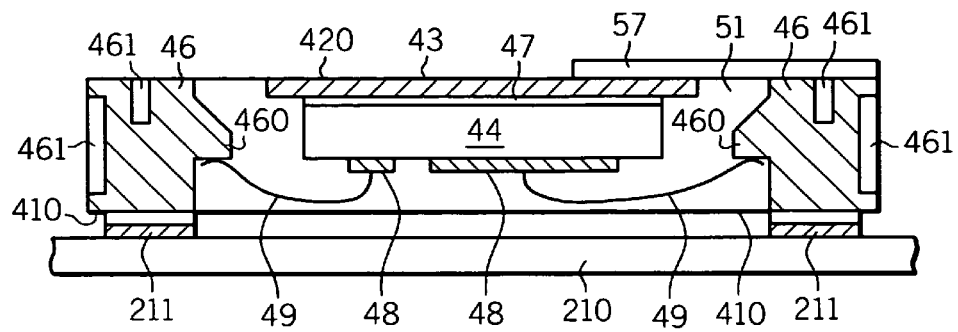
FIG. 4 illustrates a cross-sectional view of a semiconductor package in accordance with the present invention.

FIG. 4 shows a cross-sectional view of a molded package structure, semiconductor package, or packaged assembly 40 in accordance with an embodiment of the present invention. Semiconductor package 40 includes a slug, flag, or die attach paddle or portion 43, and plurality of conductive pillars, columns or columnar leads 46. In this embodiment, columnar leads 46 extend all the way through package 40 so that columnar leads 46 are exposed on both surfaces 410 and 420 of package 40. Columnar leads 46 further comprise bonding portions, ledges, extensions, projections, or structures 460. In a preferred embodiment, bonding portions 460 are integral with columnar leads 46 and project from one side of the columnar leads 46 in a direction towards slug 43.

In an optional embodiment and as shown in FIG. 4, columnar leads 46 further include mold locking grooves or structures 461 for engaging mold compounds or passivating materials. By way of example, slug 43 and columnar leads 46 comprise a material such as a copper alloy (e.g., TOMAC 4, TAMAC 5, 2ZFROFC, or CDA194), a copper plated iron/nickel alloy (e.g., copper plated Alloy 42), plated aluminum, plated plastic, or the like. Plated materials include copper, silver, or multi-layer plating such as nickel-palladium and gold.

Package 40 further includes an electronic chip or device 44, which is attached to slug 43 with an attach or solder layer 47 using conventional attachment techniques. Conductive layers 48 on electronic chip 44 are electrically connected or coupled to bonding portions 460 using conductive connective structures 49. In the embodiment shown, conductive connective structures 49 comprise wire bonds such as gold and/or aluminum wire bonds formed using conventional bonding techniques. In an alternative embodiment, conductive connective structures 49 comprise conductive clips, straps, or the like. In a still further embodiment, conductive connective structures 49 comprise a combination of wire bonds and clips or straps. By way of example, electronic chip 44 comprises a power MOSFET, bipolar power transistor, insulated gate bipolar transistor, thyristor, diode, sensor, optical device, or the like, and may include further functionality such as logic and/or memory components or circuitry.

Molded encapsulating or passivating layer 51 covers and protects portions of package 40. By way of example, encapsulating layer 51 comprises a plastic epoxy resin material, and is formed using conventional molding techniques. Package 40 is further shown attached to next level of assembly or printed circuit board 210, which includes conductive bonding portions 211.

In accordance with the present invention, package 40 is configured with slug 43 in an up manner where slug 43 is opposite printed circuit board 210 when attached thereto. This provides for, among other things, enhanced thermal dissipation, which improves device performance and reliability. Specifically, package 40 is configured so that columnar leads 46 are exposed at least at or on surface 410 of package 40 while slug 43 is exposed on opposite surface 420 of package 40. The present invention further utilizes standard die attaching, wire bonding, molding and singulating assembly steps, which saves on cost and manufacturing time.

In an alternative embodiment, package 40 may be attached to a next level of assembly using those portions of columnar leads 46 at surface 420. In other words, package 40 is configured to be attached to a next level of assembly in either a slug 43 up or down arrangement because columnar leads 46 extend all the way through package 40. That is, package 40 may be used in an up configuration when heat dissipation is important or a down configuration when chip 44 comprises a lower power application where heat dissipation is not as important. This provides added design flexibility.

It is understood that the placement or orientation of chip 44 within package 40 and the wire bond/columnar lead 46 assignments are modified according to the up or down configuration to maintain a desired I/O arrangement. Alternatively, the printed circuit board layout is modified to accommodate either configuration. In a further embodiment, a heat sink or structure (not shown) is attached to the exposed surface of slug 43 when package 40 is in a slug 43 up configuration. In a still further embodiment and as shown in FIG. 4, package 40 optionally includes a thermally conductive but electrically insulative layer 57, which allows for heat dissipation, but protects against electrical shorting at surface 420. By way of example, such films comprise aluminum nitride or boron nitride films or pastes.

Figure 5:
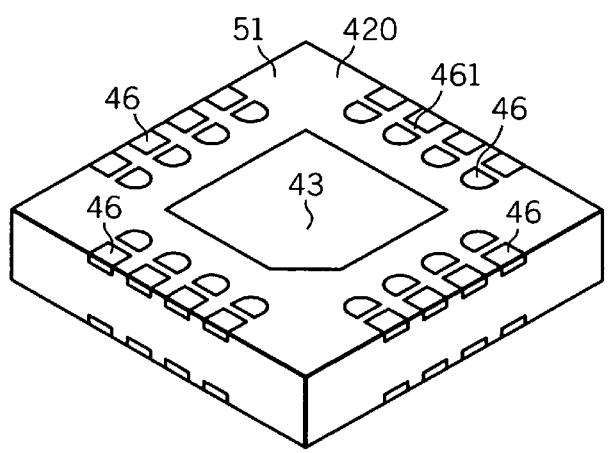
FIG. 5 illustrates an isometric top view of the semiconductor package of FIG. 4.
Figure 6:
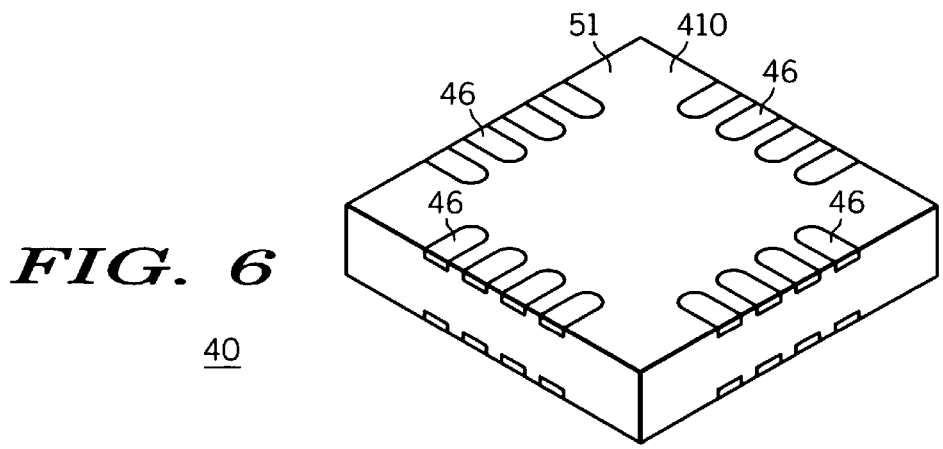
FIG. 6 illustrates an isometric bottom view of the semiconductor package of FIG. 4.

FIG. 5 shows an isometric top view of package 40 showing surface 420. As shown in FIG. 5, mold lock structures 461 are filled with encapsulating layer 51, but portions of columnar leads 46 are exposed together with slug 43. FIG. 6 shows an isometric bottom view of package 40 showing surface 410 with portions of columnar leads 46 exposed.

Figure 7:
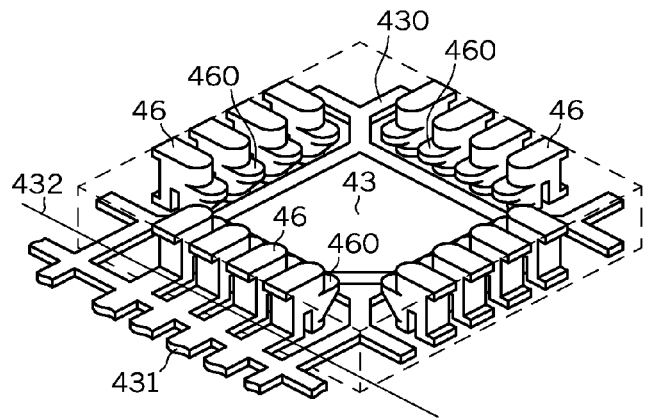
FIG. 7 illustrates an isometric view of a lead frame portion of the present invention.

Turning now to FIG. 7, an isometric view of a portion of lead frame 400 is shown to further illustrate the present invention. Lead frame 400 is shown with slug portion 43, which includes runners 430 attached thereto, which are further connected to additional slugs 43 (not shown) in a matrix lead frame configuration. By way of example, lead frame 400 is an etched or stamped lead frame. Columnar leads 46 are shown in proximity or spaced relationship with slug 43. A runner or frame 431 ties columnar leads 46 and runners 430 together for the assembly process. Runners 431 are later cut or separated away using, for example, cut line 432 in a singulation process after the packages are encapsulated.

Figure 8:
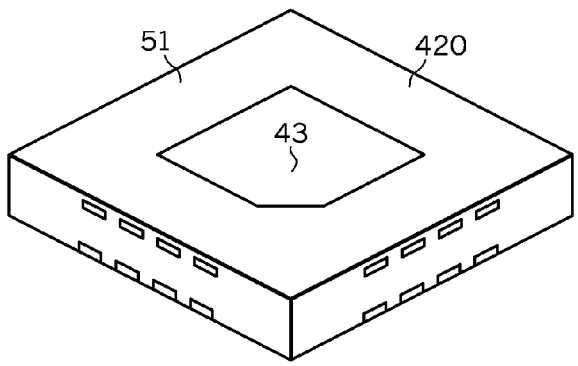
FIG. 8 illustrates an isometric top view of a semiconductor package in accordance with an alternative embodiment of the present invention.
Figure 9:
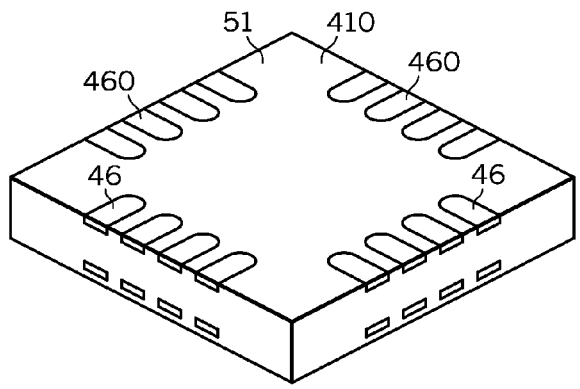
FIG. 9 illustrates an isometric bottom view of the semiconductor package of FIG. 8.

FIG. 8 shows an isometric top view of a semiconductor package 401 in accordance with an alternative embodiment of the present invention. Package 401 is similar to package 40 except in this embodiment, columnar leads 46 do not extend all the way through the package so that portions of columnar leads 46 are not exposed at surface 420 of package 401. That is, in this configuration only slug 43 is exposed at surface 420. Like package 40, slug 43 in package 41 is exposed at surface 420, and is in a slug up configuration for enhanced head dissipation. FIG. 9 shows an isometric bottom view of package 401. As shown in FIG. 9, columnar leads 46 are exposed at surface 410 for attachment to a next level of assembly such as printed circuit board 210.

Figure 10:
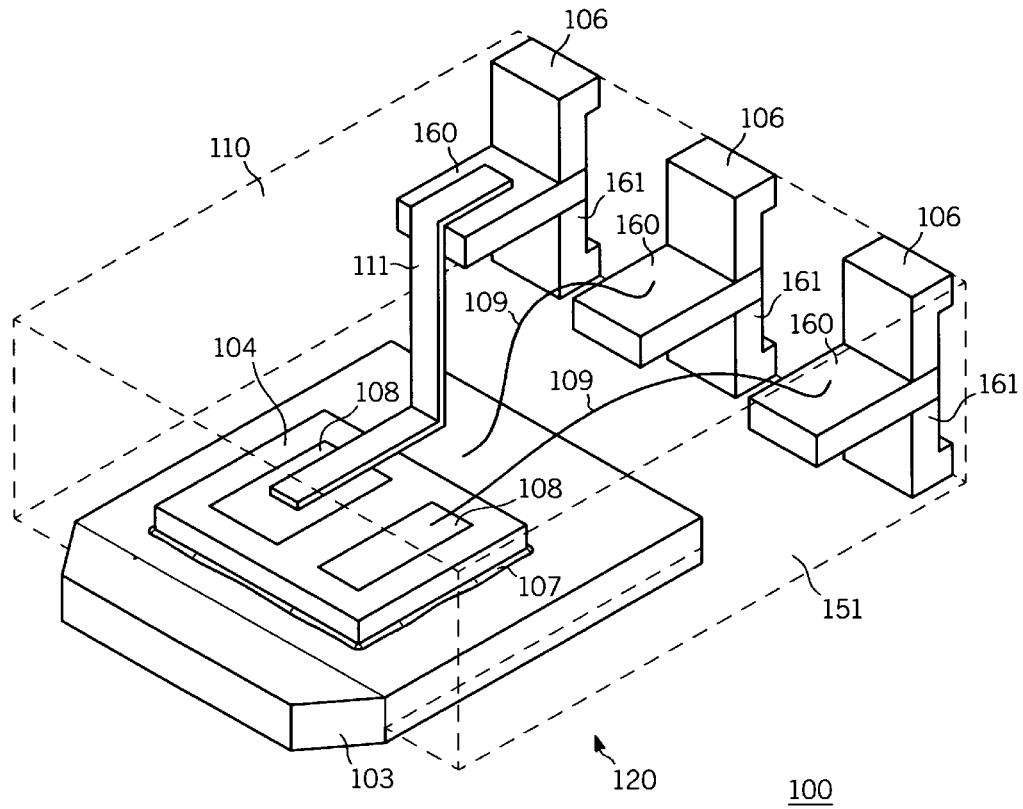
FIG. 10 illustrates an isometric bottom view of a semiconductor package in accordance with a further embodiment of the present invention.

FIG. 10 shows an isometric view of a semiconductor package 100 in accordance with a further embodiment of the present invention. Package 100 includes a slug, flag, or die attach paddle 103 and conductive pillars, columns, or columnar leads 106 in spaced relationship with slug 103. In this embodiment, columnar leads 106 are on only one side of package 100. Columnar leads 106 further comprise bonding portions, ledges, extensions, projections, or structures 160. By way of example, slug 103 and columnar leads 106 comprise a material such as a copper alloy (e.g., TOMAC 4, TAMAC 5, 2ZFROFC, or CDA194), a copper plated iron/nickel alloy (e.g., copper plated Alloy 42), plated aluminum, plated plastic, or the like. Plated materials include copper, silver, or multi-layer plating such as nickel-palladium and gold.

Package 100 further includes an electronic chip 104 attached to slug 103 with a die attach layer 107. Conductive pads 108 on chip 104 are connected or electrically coupled to columnar leads 106 using connective structures, which comprise wire bonds 109, conductive clips or straps 111, combinations thereof, or the like. In this embodiment, slug 103 is also connected to one of columnar leads 106 with a connective structure 109. In an alternative embodiment, an external conductive clip or other conductive means is attached to the outer exposed surface of slug 103 for electrically coupling slug 103 to a next level of assembly. Molded encapsulating or passivating layer 151 covers and protects portions of package 100. By way of example, encapsulating layer 151 comprises a plastic epoxy resin material, and is formed using conventional molding techniques.

In accordance with the present invention, package 100 is configured to be mounted in a slug 103 up orientation, which provides for enhanced heat dissipation when package 10 is attached to a next level of assembly and in operation. Also, since columnar leads 106 pass all the way through package 100 so that columnar leads 106 are exposed on both surfaces 110 and 120 of package 100, package 100 may be used in either an up configuration when heat dissipation is important, or a down configuration when chip 104 comprises a lower power application where heat dissipation is not as important. This provides added design flexibility.

Figure 11:
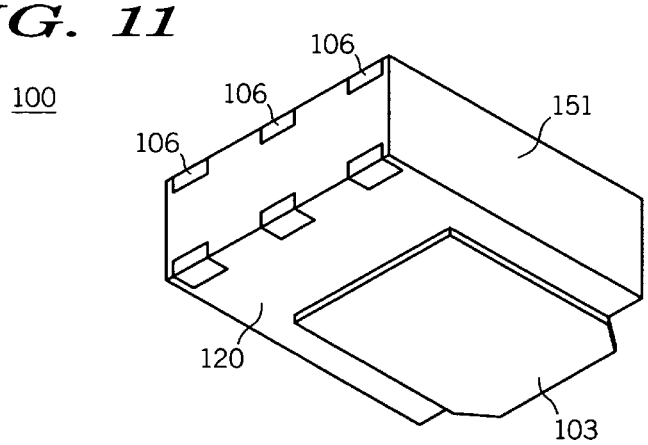
FIG. 11 illustrates an isometric top view of the semiconductor package of FIG. 10.

In alternative embodiment, columnar leads 106 do not pass all the way through package 100, and are exposed only on side 110 of package 100 and package 100 is then mounted in a slug 103 up configuration only. By way of example, in this embodiment portions 161 of columnar leads 106 are removed. This embodiment is further shown in FIG. 11, which is an isometric view of package 100 looking at surface 120 and slug 103. When mounted to a next level of assembly (e.g., printed circuit board 210 shown in FIG. 4), slug 103 is in an up configuration with surface 110 placed adjacent to the next level of assembly. It is understood that when mounted in an up configuration, an additional heat sink is attached to slug 103 to further enhance heat dissipation. Additionally, a thermally conductive but electrically insulative layer may be optionally added to surface 120 as described above in conjunction with FIG. 4.

Thus, it is apparent that there has been provided, in accordance with the present invention, a package structure and method of assembly where the structure is configured in a slug up orientation. In power device applications, this enhances the heat dissipation capabilities of the package and improves performance and reliability. In one embodiment, the columnar leads extend through the package and are exposed on both sides of the package. This provides further assembly and design flexibility. Additionally, package structure utilizes conventional packaging processes, which saves on manufacturing and implementation costs.

Although the invention has been described and illustrated with reference to specific embodiments thereof, it is not intended that the invention be limited to these illustrative embodiments.

What is claimed is:

1. A semiconductor package having first and second opposing major surfaces comprising:
    a conductive slug having an electronic chip attached to one surface;
    a plurality of columnar leads in spaced relationship to the conductive slug, wherein each of the plurality of columnar leads includes a bonding projection, and wherein each of the plurality of columnar leads has a pair of opposing end faces that substantially overlap and that are substantially parallel to the first and second opposing major surfaces;
    conductive connective structures electrically coupling the electronic chip to the bonding projections; and
    an encapsulating layer covering portions of the conductive slug, the plurality of columnar leads, and the electronic chip, wherein at least one of the opposing end faces of each columnar leads is exposed on the first major surface, and wherein the conductive slug is exposed on the second major surface.

2. The package of claim 1 wherein another opposing end face of at least a portion of each of the plurality of columnar leads is further exposed at the second major surface.

3. The package of claim 1 wherein at least a portion of the plurality of columnar leads are each exposed in at least two places along a side surface of the package to provide mold lock structures.

4. The package of claim 1 further comprising a layer of thermally conductive and electrically insulative material formed over the second major surface.

5. The package of claim 1 wherein the columnar leads are absent exposure at the second surface of the package.

6. The package of claim 1 wherein the bonding portions are integral with the plurality of columnar leads, and wherein each bonding portion projects from one side of each columnar lead in a direction towards the conductive slug, and wherein at least one bonding portion is substantially centrally located on at least one columnar lead.

7. The package of claim 1 wherein the conductive connective structures comprise wire bonds.

8. The package of claim 1 wherein at least one of the conductive connective structures comprises a conductive clip.

9. A molded semiconductor package structure having first and second opposing major surfaces comprising:
    a flag having a semiconductor device attached to one surface;
    a plurality of conductive pillars in spaced relationship with the flag, wherein each conductive pillar includes a bonding extension, and wherein each conductive pillar includes a pair of opposing faces that substantially overlap and that are substantially parallel to the first and second major surfaces;
    conductive connective structures electrically coupling the semiconductor device to the bonding extensions; and
    an encapsulation layer covering portions of the molded semiconductor package structure, wherein at least one of the opposing faces of at least a portion of each of the plurality of conductive pillars is exposed at the first major surface, and wherein the flag is exposed at the second major surface so that the molded semiconductor package structure is configured to be mounted in a slug up orientation when the molded semiconductor package structure is attached to a next level of assembly.

10. The package of claim 9 wherein the plurality of conductive pillars are further exposed at the second major surface.

11. The package of claim 9, wherein at least a portion of the plurality of conductive pillars are each exposed in at least two places along a side surface of the package to provide mold lock structures.

12. The package of claim 9, wherein the plurality of conductive pillars are on only one side of the package.

13. The package of claim 9, wherein the conductive connective structures comprise wire bonds.

14. The package of claim 9, wherein at least one of the conductive connective structures comprises a clip.

15. The package of claim 9 further comprising a layer of thermally conductive and electrically insulative material formed over the second major surface.

16. A method of forming a molded semiconductor package structure having first and second opposing major surfaces comprising the steps of:
    providing a lead frame having a flag and a plurality of conductive pillars in spaced relationship with the flag, wherein the each conductive pillar includes a bonding extension, and wherein each conductive pillar includes a pair of opposing faces that substantially overlap, and wherein the pair of opposing faces is substantially parallel to the first and second major surfaces;
    attaching a semiconductor device to one surface of the flag;
    attaching conductive connective structures to the semiconductor device and the bonding extensions; and
    forming an encapsulation layer covering portions of the molded semiconductor package structure, wherein at least one of the opposing faces of at least a portion of the plurality of conductive pillars is exposed at the first major surface, and wherein the flag is exposed at the second major surface so that the molded semiconductor package structure is configured to be mounted in a slug up orientation when the molded semiconductor package structure is attached to a next level of assembly.

17. The method of claim 16 wherein the step of forming the encapsulation layer includes forming the encapsulation layer wherein another one of the opposing faces of at least a portion of each of the plurality of conductive pillars is further exposed at the second major surface.

18. The method of claim 16, wherein the step of providing the lead frame includes providing a lead frame having a plurality of conductive pillars on only one side.

19. The method of claim 16, wherein the step of attaching the conductive connective structures includes attaching with wire bonds.

20. The method of claim 16 further comprising the step of forming a thermally conductive and electrically insulative layer over the second major surface.

\* \* \* \* \*